(12) United States Patent
Basker et al.

(10) Patent No.: US 9,991,366 B2
(45) Date of Patent: Jun. 5, 2018

(54) ANCHORED STRESS-GENERATING ACTIVE SEMICONDUCTOR REGIONS FOR SEMICONDUCTOR-ON-INSULATOR FINFET

(71) Applicant: GLOBALFOUNDRIES INC., Grand Cayman (KY)

(72) Inventors: Veeraraghavan S. Basker, Schenectady, NY (US); Krishna Iyengar, Chennai (IN); Tenko Yamashita, Schenectady, NY (US); Chun-Chen Yeh, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 122 days.

(21) Appl. No.: 15/092,039

(22) Filed: Apr. 6, 2016

(65) Prior Publication Data

US 2016/0218198 A1 Jul. 28, 2016

Related U.S. Application Data

(62) Division of application No. 13/961,522, filed on Aug. 7, 2013, now Pat. No. 9,349,863.

(51) Int. Cl.
*H01L 21/336* (2006.01)
*H01L 29/66* (2006.01)
(Continued)

(52) U.S. Cl.
CPC ...... *H01L 29/66795* (2013.01); *H01L 29/045* (2013.01); *H01L 29/0847* (2013.01);
(Continued)

(58) Field of Classification Search
CPC ............. H01L 29/66795; H01L 29/045; H01L 29/0847; H01L 29/785; H01L 29/165; H01L 29/7848
(Continued)

(56) References Cited

U.S. PATENT DOCUMENTS 4,317,125 A 2/1982 Hughes et al.
6,800,885 B1 10/2004 An et al.
(Continued)

OTHER PUBLICATIONS

Donaton, R.A. et al., "Design and Fabrication of MOSFETs with a Reverse Embedded SiGe (Rev. e-SiGe) Structure" International Electron Devices Meeting (Dec. 11-13, 2006) pp. 1-4.
(Continued)

*Primary Examiner* — Anthony Ho
*Assistant Examiner* — Mohammad M Hoque
(74) *Attorney, Agent, or Firm* — Scully Scott Murphy and Presser; Frank Digiglio

(57) ABSTRACT

After formation of a gate structure and a gate spacer, portions of an insulator layer underlying a semiconductor fin are etched to physically expose semiconductor surfaces of an underlying semiconductor material layer from underneath a source region and a drain region. Each of the extended source region and the extended drain region includes an anchored single crystalline semiconductor material portion that is in epitaxial alignment to the single crystalline semiconductor structure of the underlying semiconductor material layer and laterally applying a stress to the semiconductor fin. Because each anchored single crystalline semiconductor material portion is in epitaxial alignment with the underlying semiconductor material layer, the channel of the fin field effect transistor is effectively stressed along the lengthwise direction of the semiconductor fin.

19 Claims, 10 Drawing Sheets

(51) Int. Cl.
*H01L 29/78* (2006.01)
*H01L 29/165* (2006.01)
*H01L 29/04* (2006.01)
*H01L 29/08* (2006.01)

(52) U.S. Cl.
CPC .......... *H01L 29/165* (2013.01); *H01L 29/785* (2013.01); *H01L 29/7848* (2013.01)

(58) Field of Classification Search
USPC ....................................................... 438/198
See application file for complete search history.

(56) References Cited

U.S. PATENT DOCUMENTS

| | | | |
|---|---|---|---|
| 7,238,989 B2 | 7/2007 | Yeo et al. | |
| 7,566,482 B2 | 7/2009 | Choe et al. | |
| 7,781,800 B2 | 8/2010 | Chen et al. | |
| 8,124,470 B1 | 2/2012 | Bedell et al. | |
| 8,409,974 B2 | 4/2013 | Cohen et al. | |
| 2004/0018672 A1 | 1/2004 | Bohr | |
| 2004/0169239 A1 | 9/2004 | Rim | |
| 2004/0195624 A1 | 10/2004 | Liu et al. | |
| 2005/0073060 A1 | 4/2005 | Datta et al. | |
| 2005/0148137 A1* | 7/2005 | Brask .............. | H01L 21/823821 438/216 |
| 2005/0161711 A1 | 7/2005 | Chu | |
| 2008/0048233 A1 | 2/2008 | Zhu et al. | |
| 2009/0061572 A1 | 3/2009 | Hareland et al. | |
| 2009/0065869 A1 | 3/2009 | Ohguro et al. | |
| 2010/0184261 A1* | 7/2010 | Yagishita ......... | H01L 29/66636 438/157 |
| 2011/0068407 A1 | 3/2011 | Yeh et al. | |
| 2011/0254090 A1 | 10/2011 | Cheng et al. | |
| 2013/0005103 A1 | 1/2013 | Liu et al. | |
| 2013/0009215 A1 | 1/2013 | Russ et al. | |
| 2013/0029478 A1 | 1/2013 | Zhang et al. | |
| 2013/0187129 A1* | 7/2013 | Cheng .................... | B82Y 10/00 257/24 |
| 2014/0054648 A1* | 2/2014 | Itokawa .............. | H01L 29/7853 257/192 |
| 2014/0191297 A1 | 7/2014 | Utomo et al. | |
| 2014/0225065 A1* | 8/2014 | Rachmady ........ | H01L 29/42392 257/24 |

OTHER PUBLICATIONS

Tan, K.M. et al., "Strained p-Channel FinFETs With Extended Π-Shaped Silicon-Germanium Source and Drain Stressors" IEEE Electron Device Letters (Oct. 2007) pp. 905-908, vol. 28.

Saitoh, M. et al., "Three-Dimensional Stress Engineering in FinFETs for Mobility/On-Current Enhancement and Gate Current Reduction" 2008 Symposium on VLSI Technology (Jun. 17-19, 2008) pp. 18-19.

* cited by examiner

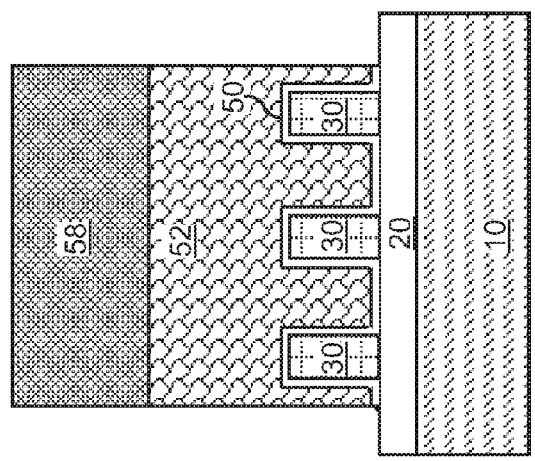
FIG. 2C
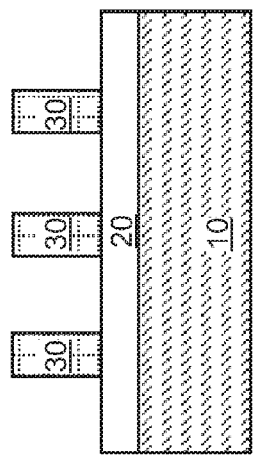
FIG. 2D
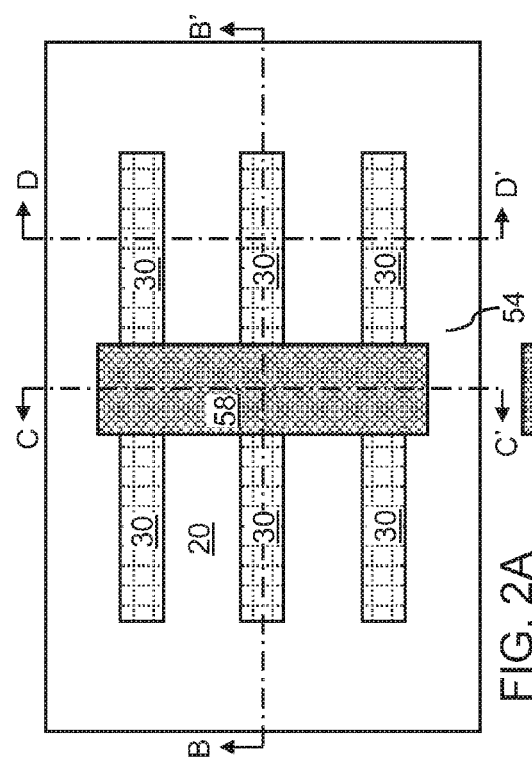
FIG. 2A
FIG. 2B
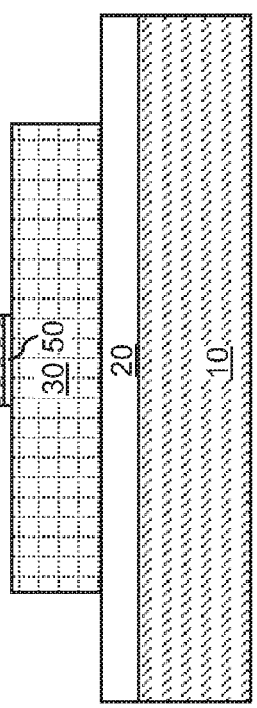

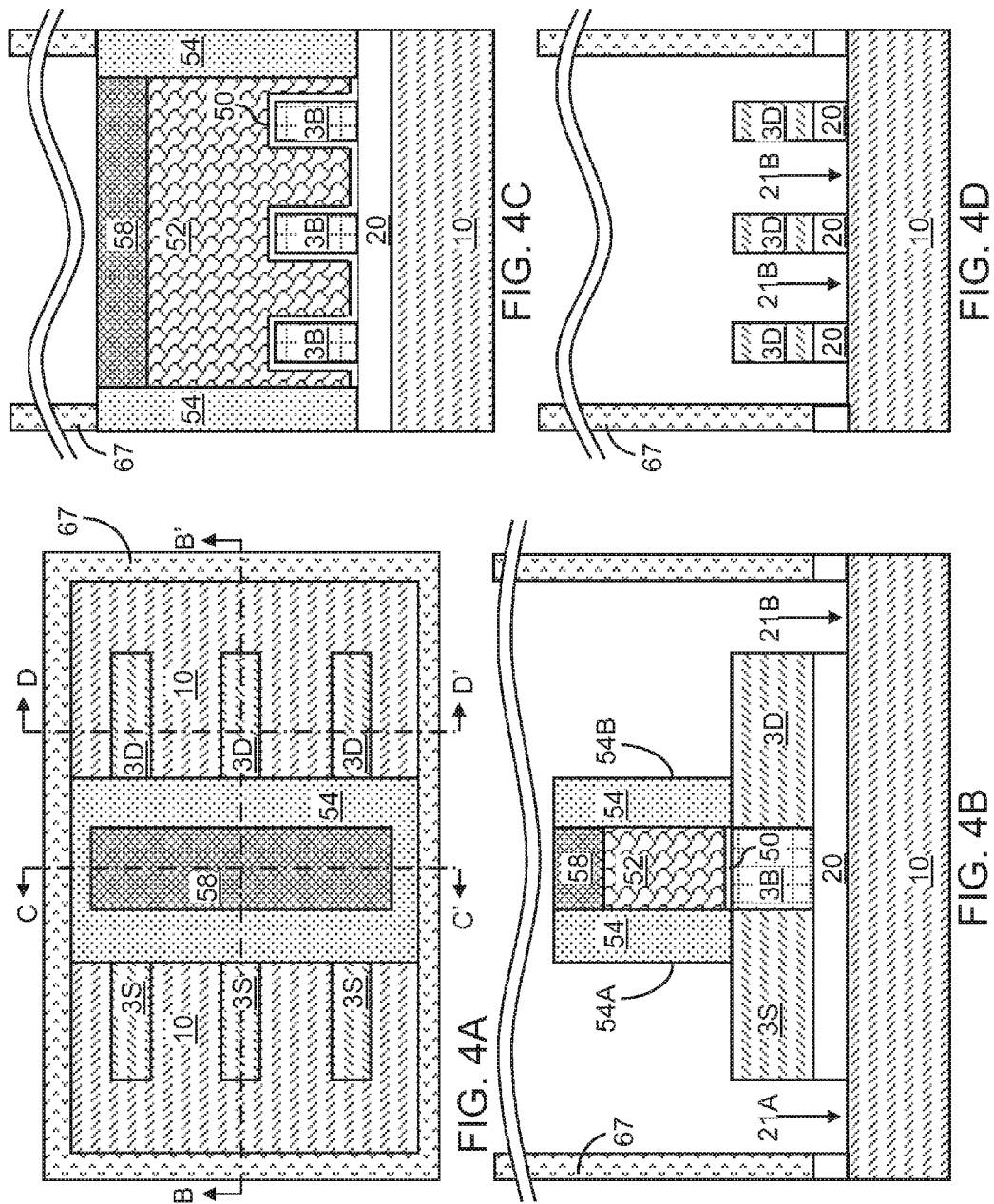

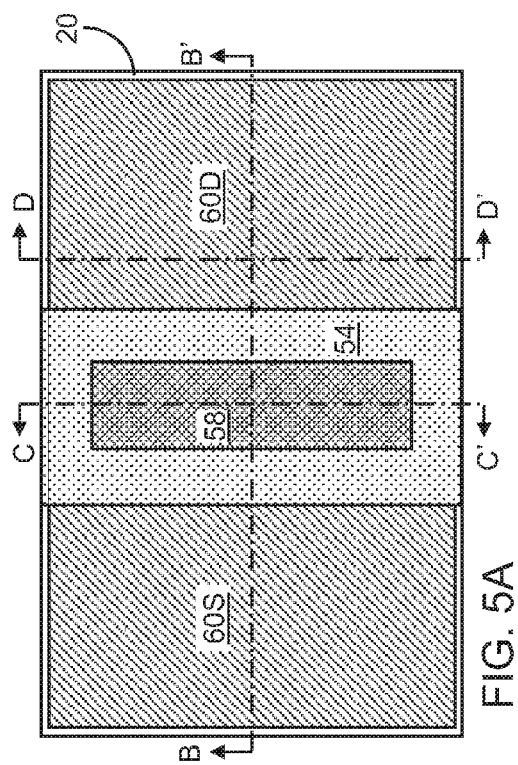
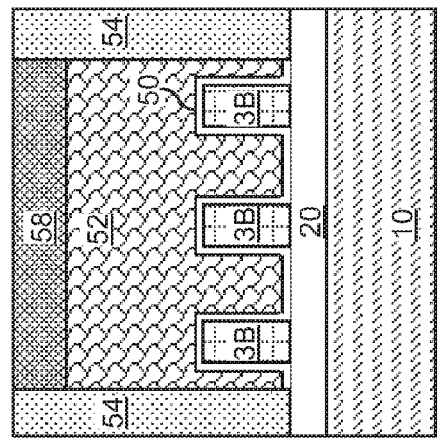
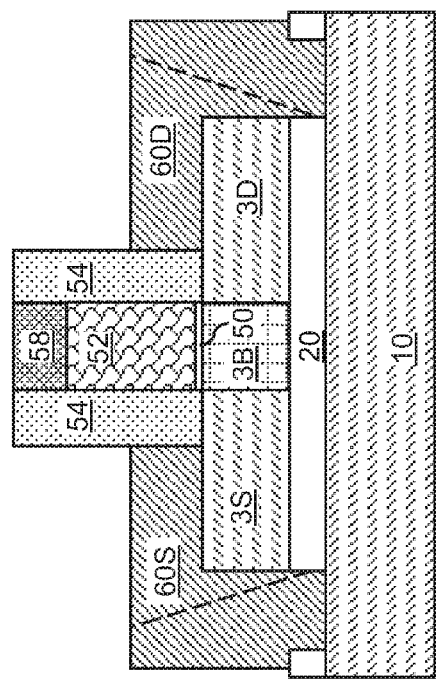
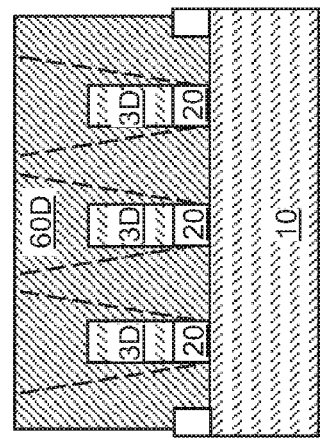

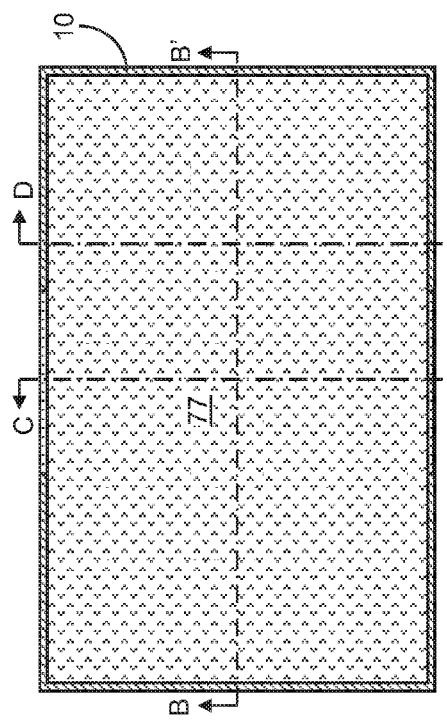
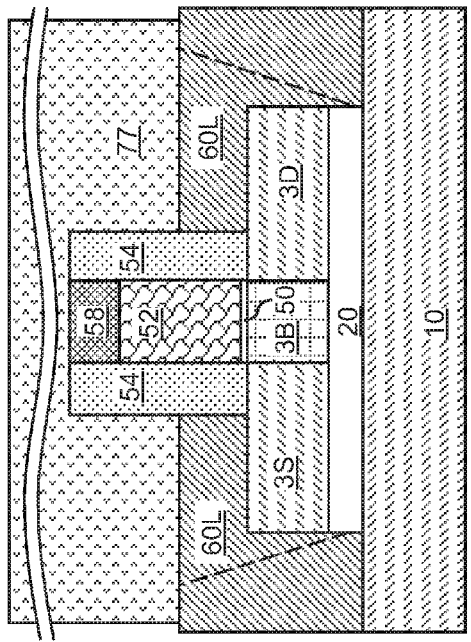
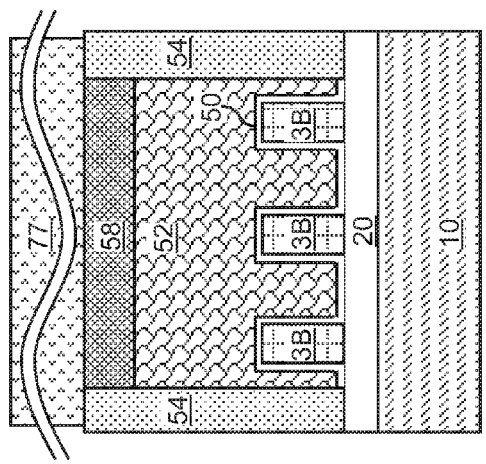
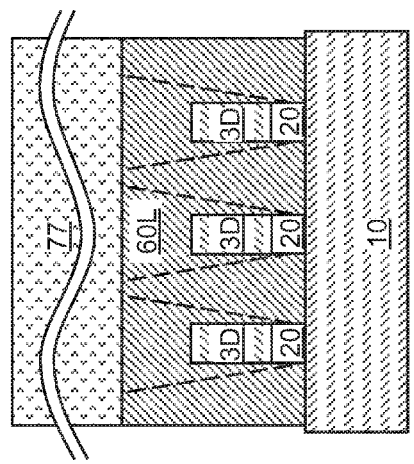
FIG. 7A
FIG. 7B
FIG. 7C
FIG. 7D

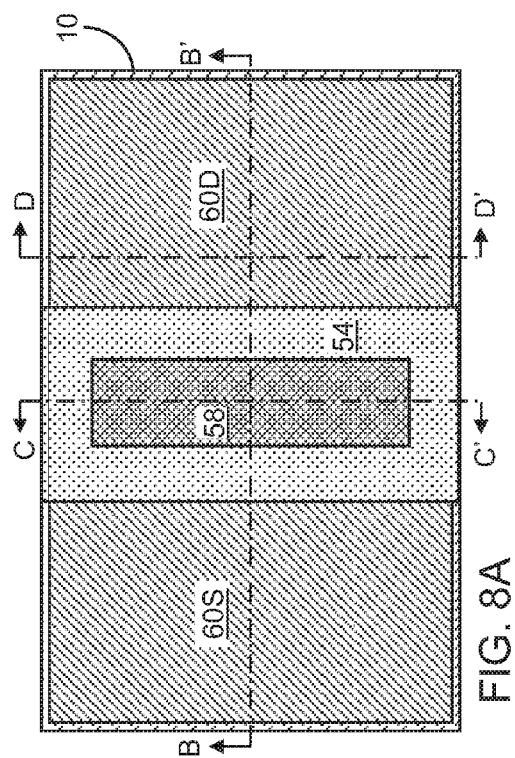
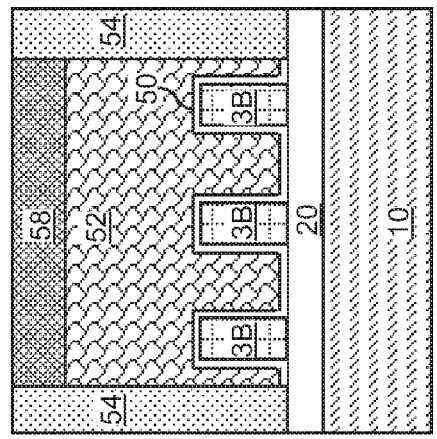
FIG. 8C
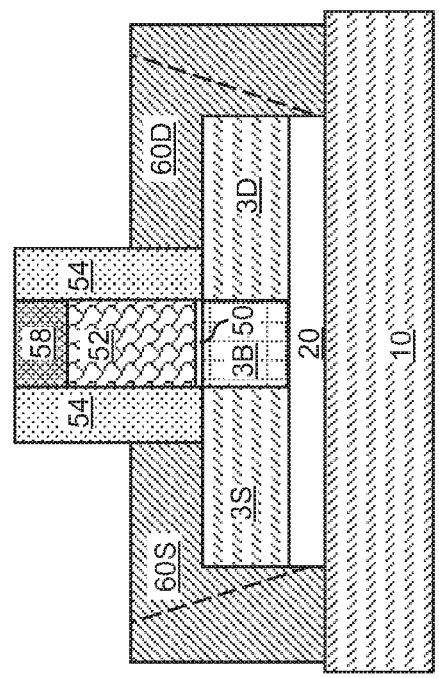
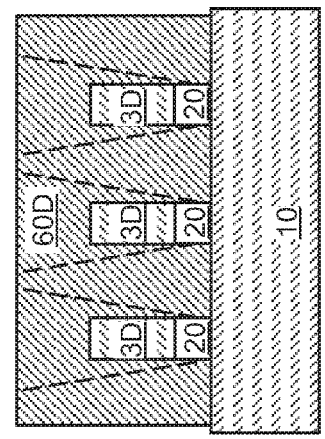
FIG. 8D

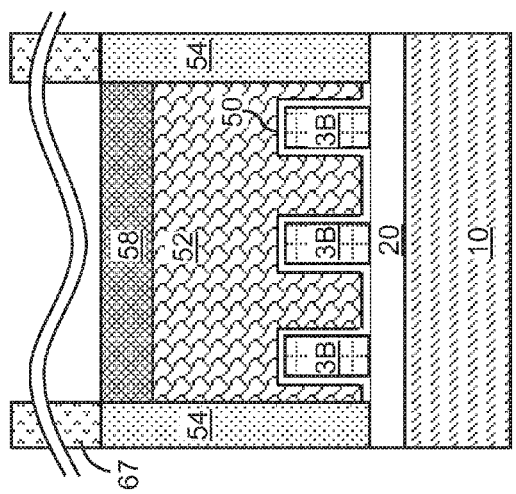
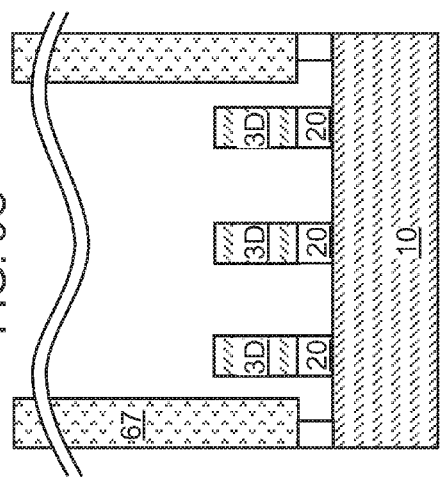
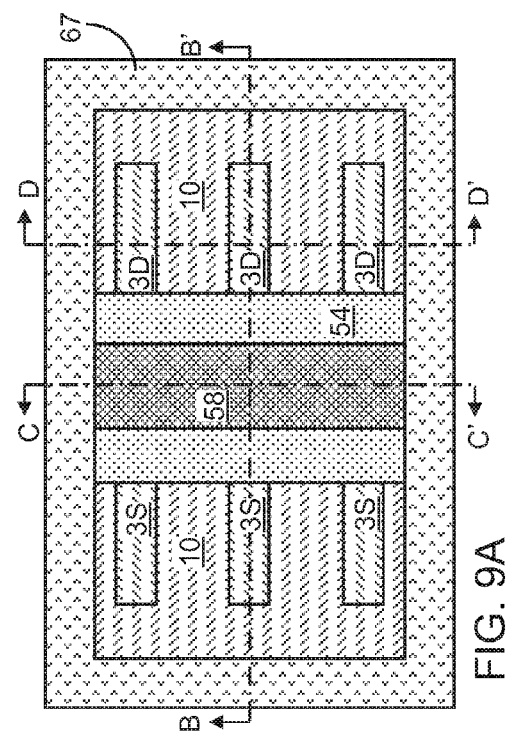
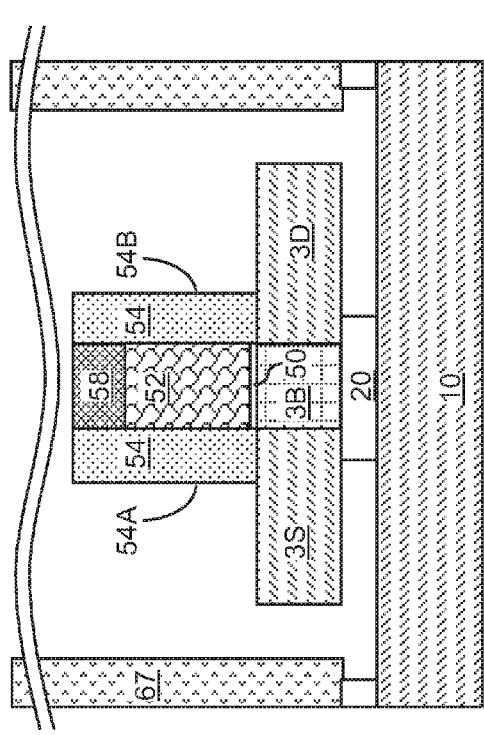

US 9,991,366 B2

ANCHORED STRESS-GENERATING ACTIVE SEMICONDUCTOR REGIONS FOR SEMICONDUCTOR-ON-INSULATOR FINFET

RELATED APPLICATION

This application is a divisional of U.S. Ser. No. 13/961,522, filed Aug. 7, 2013, the entire contents of which are incorporated herein by reference.

BACKGROUND

The present disclosure relates to a semiconductor structure, and more particularly to a fin field effect transistor on a semiconductor-on-insulator substrate that includes stress-generating active semiconductor regions anchored to an underlying semiconductor layer, and a method of manufacturing the same.

Stress in a channel region of a fin field effect transistor can enhance the performance of the fin field effect transistor by increasing the mobility of minority charge carriers within the channel region. For fin field effect transistors formed on a semiconductor-on-insulator (SOI) substrate, the only physically exposed semiconductor surfaces are surfaces of source regions and drain regions of the SOI fin field effect transistor. Any stress applied by the semiconductor stressor elements tends to be applied along the direction of the width of the semiconductor fin. Thus, attempts to incorporate semiconductor stressor elements into a fin field effect transistor on an SOI substrate have been largely unsuccessful so far.

SUMMARY

After formation of a gate structure and a gate spacer, portions of an insulator layer underlying a semiconductor fin are etched to physically expose semiconductor surfaces of an underlying semiconductor material layer from underneath a source region and a drain region. The crystallographic orientations of the physically exposed semiconductor surfaces and sidewall surfaces of the semiconductor fin are selected such that epitaxial growth can proceed faster from the physically exposed semiconductor surface of the underlying semiconductor material layer than from sidewalls of the semiconductor fin. Each of the extended source region and the extended drain region includes an anchored single crystalline semiconductor material portion that is in epitaxial alignment to the single crystalline semiconductor structure of the underlying semiconductor material layer and laterally applying a stress to the semiconductor fin. Because each anchored single crystalline semiconductor material portion is in epitaxial alignment with the underlying semiconductor material layer, the channel of the fin field effect transistor is effectively stressed along the lengthwise direction of the semiconductor fin.

According to an aspect of the present disclosure, a semiconductor structure includes a single crystalline semiconductor material layer located in a substrate. An insulator layer contacts a top surface of the single crystalline semiconductor material layer. A semiconductor fin contacts a portion of a top surface of the insulator layer. A gate stack contacts another portion of the top surface of the insulator layer, and straddles the semiconductor fin. A gate spacer laterally surrounds the gate stack and straddles the semiconductor fin. An extended source region contacts, and is epitaxially aligned to, a first portion of the top surface of the single crystalline semiconductor material layer, and contacts a first end portion of the semiconductor fin laterally protruding from a first outer sidewall of the gate spacer. An extended drain region contacts, and is epitaxially aligned to, a second portion of the top surface of the single crystalline semiconductor material layer, and contacts a second end portion of the semiconductor fin laterally protruding from a second outer sidewall of the gate spacer.

According to another aspect of the present disclosure, a method of forming a semiconductor structure is provided. A semiconductor fin is formed on a stack, from bottom to top, of a single crystalline semiconductor material layer and an insulator layer. A gate stack is formed over the semiconductor fin. A gate spacer is formed around the gate stack. A first portion and a second portion of a top surface of the single crystalline semiconductor material layer are physically exposed. An extended source region is formed on the first portion and an extended drain region is formed on the second portion by selective deposition of an epitaxial semiconductor material on the first portion, the second portion, and physically exposed surfaces of the semiconductor fin.

BRIEF DESCRIPTION OF SEVERAL VIEWS OF THE DRAWINGS

FIG. 2A is a top-down view of the first exemplary semiconductor structure after formation of a gate stack according to the first embodiment of the present disclosure.

FIG. 2B is a vertical cross-sectional view of the first exemplary semiconductor structure along the vertical plane B-B' in FIG. 2A.

FIG. 2C is a vertical cross-sectional view of the first exemplary semiconductor structure along the vertical plane C-C' in FIG. 2A.

FIG. 2D is a vertical cross-sectional view of the first exemplary semiconductor structure along the vertical plane D-D' in FIG. 2A.

FIG. 4A is a top-down view of the first exemplary semiconductor structure after application and patterning of a photoresist layer and formation of openings through an insulator layer according to the first embodiment of the present disclosure.

FIG. 4B is a vertical cross-sectional view of the first exemplary semiconductor structure along the vertical plane B-B' in FIG. 4A.

FIG. 4C is a vertical cross-sectional view of the first exemplary semiconductor structure along the vertical plane C-C' in FIG. 4A.

FIG. 4D is a vertical cross-sectional view of the first exemplary semiconductor structure along the vertical plane D-D' in FIG. 4A.

FIG. 5A is a top-down view of the first exemplary semiconductor structure after formation of an extended source region and an extended drain region according to the first embodiment of the present disclosure.

FIG. 5B is a vertical cross-sectional view of the first exemplary semiconductor structure along the vertical plane B-B' in FIG. 5A.

FIG. 5C is a vertical cross-sectional view of the first exemplary semiconductor structure along the vertical plane C-C' in FIG. 5A.

FIG. 5D is a vertical cross-sectional view of the first exemplary semiconductor structure along the vertical plane D-D' in FIG. 5A.

FIG. 7A is a top-down view of a variation of the variation of the first exemplary semiconductor structure after formation of an active semiconductor material layer and application and patterning of a photoresist layer according to the first embodiment of the present disclosure.

FIG. 7B is a vertical cross-sectional view of the variation of the first exemplary semiconductor structure along the vertical plane B-B' in FIG. 7A.

FIG. 7C is a vertical cross-sectional view of the variation of the first exemplary semiconductor structure along the vertical plane C-C' in FIG. 7A.

FIG. 7D is a vertical cross-sectional view of the variation of the first exemplary semiconductor structure along the vertical plane D-D' in FIG. 7A.

FIG. 8A is a top-down view of a variation of the variation of the first exemplary semiconductor structure after patterning of the active semiconductor material layer into an extended source region and an extended drain region and removal of the photoresist layer according to the first embodiment of the present disclosure.

FIG. 8B is a vertical cross-sectional view of the variation of the first exemplary semiconductor structure along the vertical plane B-B' in FIG. 8A.

FIG. 8C is a vertical cross-sectional view of the variation of the first exemplary semiconductor structure along the vertical plane C-C' in FIG. 8A.

FIG. 8D is a vertical cross-sectional view of the variation of the first exemplary semiconductor structure along the vertical plane D-D' in FIG. 8A.

FIG. 9A is a top-down view of a second exemplary semiconductor structure after a lateral etch of the insulator layer according to the second embodiment of the present disclosure.

FIG. 9B is a vertical cross-sectional view of the second exemplary semiconductor structure along the vertical plane B-B' in FIG. 9A.

FIG. 9C is a vertical cross-sectional view of the second exemplary semiconductor structure along the vertical plane C-C' in FIG. 9A.

FIG. 9D is a vertical cross-sectional view of the second exemplary semiconductor structure along the vertical plane D-D' in FIG. 9A.

DETAILED DESCRIPTION

Figure 1A:
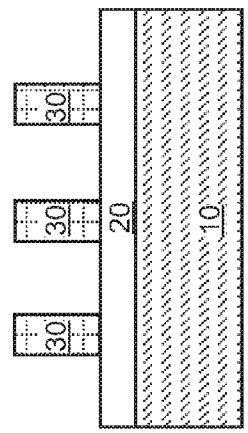
FIG. 1A is a top-down view of a first exemplary semiconductor structure after formation of a plurality of semiconductor fins according to a first embodiment of the present disclosure.

As stated above, the present disclosure relates to a fin field effect transistor on a semiconductor-on-insulator substrate that includes stress-generating active semiconductor regions anchored to an underlying semiconductor layer, and a method of manufacturing the same. Aspects of the present disclosure are now described in detail with accompanying figures. It is noted that like reference numerals refer to like elements across different embodiments. The drawings are not necessarily drawn to scale.

Figure 1C:
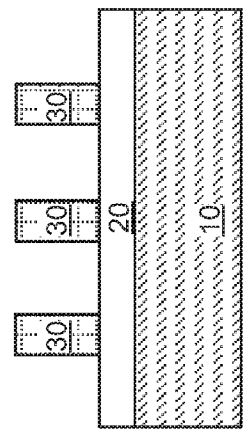
FIG. 1C is a vertical cross-sectional view of the first exemplary semiconductor structure along the vertical plane C-C' in FIG. 1A.
Figure 1B:
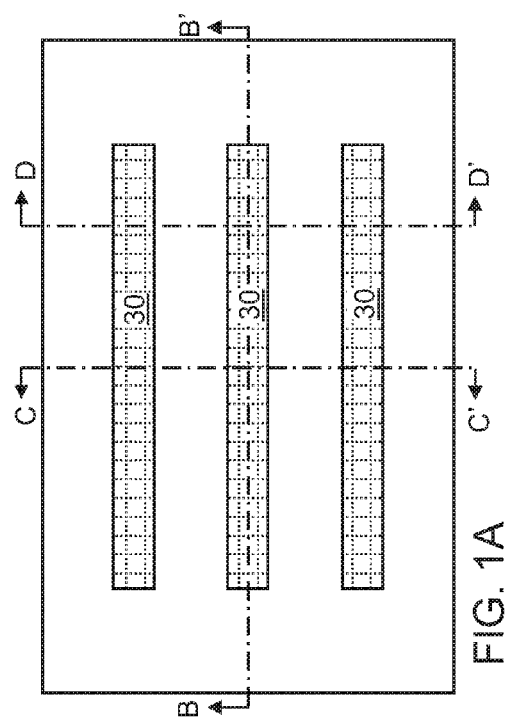
FIG. 1B is a vertical cross-sectional view of the first exemplary semiconductor structure along the vertical plane B-B' in FIG. 1A.
Figure 1D:
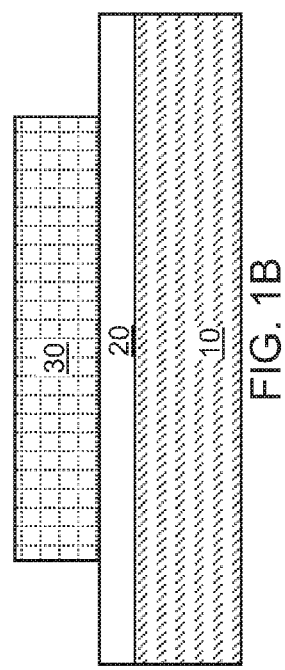
FIG. 1D is a vertical cross-sectional view of the first exemplary semiconductor structure along the vertical plane D-C' in FIG. 1A.

Referring to FIGS. 1A-1D, an exemplary semiconductor structure according to an embodiment of the present disclosure includes a single crystalline semiconductor material layer 10, an insulator layer 20, and a plurality of semiconductor fins 30 on the insulator layer. The single crystalline semiconductor material layer 10 includes a first semiconductor material. The single crystalline semiconductor material layer 10 can be a single crystalline material portion of the first semiconductor material. The first semiconductor material can be, for example, silicon, germanium, silicon-germanium alloy, silicon carbon alloy, silicon-germanium-carbon alloy, gallium arsenide, indium arsenide, indium phosphide, other III-V compound semiconductor materials, II-VI compound semiconductor materials, organic semiconductor materials, and other compound semiconductor materials. In an exemplary case, the semiconductor material comprises single crystalline silicon. The insulator layer 20 includes a dielectric material such as silicon oxide, silicon nitride, and/or silicon oxynitride. In one embodiment, a top surface of the single crystalline semiconductor material layer 10 can have a (001) surface orientation.

The plurality of semiconductor fins 30 includes a second semiconductor material. The second semiconductor material may be selected from, but is not limited to, silicon, germanium, silicon-germanium alloy, silicon carbon alloy, silicon-germanium-carbon alloy, gallium arsenide, indium arsenide, indium phosphide, other III-V compound semiconductor materials, II-VI compound semiconductor materials, organic semiconductor materials, and other compound semiconductor materials. In an exemplary case, the semiconductor material can include single crystalline silicon or a single crystalline alloy of silicon. In one embodiment, the semiconductor material in each of the plurality of semiconductor fins 30 can be single crystalline. The semiconductor material of the plurality of semiconductor fins 30 can be the same as, or different from, the semiconductor material of the single crystalline semiconductor material layer 10.

The plurality of semiconductor fins 30 can be formed, for example, by patterning a single crystalline semiconductor layer. In one embodiment, the single crystalline semiconductor layer can be a top semiconductor layer within a semiconductor-on-insulator (SOI) substrate including a vertical stack of the single crystalline semiconductor material layer 10, the insulator layer 20, and the top semiconductor layer. For example, a patterned photoresist layer can be formed over the top semiconductor layer of the SOI substrate and the top semiconductor layer can be patterned into the plurality of semiconductor fins 30 by transferring the pattern in the patterned photoresist layer with an anisotropic etch. Dielectric fin caps (not shown) having the same horizontal cross-sectional area as an underlying semiconductor fin 30 may be optionally formed on the top surface of each semiconductor fin 30.

In one embodiment, the plurality of semiconductor fins 30 may be doped with p-type dopants or n-type dopants. If the plurality of semiconductor fins 30 is doped, the type of doping of the plurality of semiconductor fins 30 is herein referred to as a first conductivity type. The electrical dopants may be at least one of p-type dopants such as B, Ga, and In. Alternately, the electrical dopants may be at least one of n-type dopants such as P, As, and Sb. The concentration of the electrical dopants (p-type dopants or n-type dopants) in the plurality of semiconductor fins 30 may be from $1.0 \times 10^{15}$ atoms/cm$^3$ to $1.0 \times 10^{19}$ atoms/cm$^3$, although lesser and greater concentrations can also be employed. Non-electrical stress-generating dopants such as Ge and/or C may also be present in the plurality of semiconductor fins 30 in some embodiments.

In one embodiment, the semiconductor material layer from which the plurality of semiconductor fins 30 is patterned can have a (001) surface orientation. Further, the orientations of the plurality of semiconductor fins 30 can be selected such that each of the plurality of semiconductor fins 30 includes a (001) top surface, (110) sidewall surfaces, and (1$\bar{1}$0) end walls. As used herein, sidewall surfaces refer to vertical surfaces laterally extending along the lengthwise direction of a semiconductor fin, and end surfaces refer to vertically surfaces that are perpendicular to the lengthwise direction of the semiconductor fin. As used herein, a lengthwise direction of an object refers to the direction along which the moment of inertia of the object has the minimum value.

The height of the plurality of semiconductor fins can be from 20 nm to 300 nm, although greater and lesser thicknesses can also be employed. The width of each semiconductor fin 30 along the horizontal direction included in the vertical plane B-B' can be from 3 nm to 100 nm, although lesser and greater widths can also be employed. The length of each semiconductor fin 30 along the direction perpendicular to the vertical plane B-B' can be from 60 nm to 1,000 nm, although lesser and greater lengths can also be employed.

Referring to FIGS. 2A-2D, a gate dielectric 50, a gate electrode 52, and a gate cap dielectric 58 are formed over a middle portion of each semiconductor fin 30 by deposition and patterning of a gate dielectric layer, a gate conductor layer, and a gate cap dielectric layer. The gate dielectric layer can be formed conformally on the surfaces of the plurality of semiconductor fins 30.

In one embodiment, the gate dielectric layer can include a dielectric material formed by thermal conversion of a portion of the semiconductor fin, such as silicon oxide or silicon nitride. Thermal oxidation, thermal nitridation, plasma oxidation, plasma nitridation, or a combination thereof may be employed to form the gate dielectric layer. In this case, the gate dielectric layer can be formed only on physically exposed surfaces of the plurality of semiconductor fin 30.

Alternately or additionally, the gate dielectric layer may include a high-k dielectric material having a dielectric constant greater than 3.9, i.e., the dielectric constant of silicon oxide. The high-k dielectric material may comprise a dielectric metal oxide containing a metal and oxygen. In one embodiment, the dielectric constant of the high-k material is greater than or about 4.0. In one embodiment, the dielectric constant of the high-k dielectric material is greater than the dielectric constant of silicon nitride, which is about 7.5. In one embodiment, the dielectric constant of the high-k dielectric material is greater than 8.0. The high-k dielectric materials are also known in the art as high-k gate dielectric materials, which include dielectric metal oxides, alloys thereof, and silicate alloys thereof. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x can be independently from about 0.5 to about 3 and each value of y can be independently from 0 to about 2. Optionally, an interfacial layer (not shown), for example, silicon oxide, can be formed by chemical oxidation or thermal oxidation before the high-k dielectric material is deposited.

The gate conductor layer can be deposited on the gate dielectric layer, for example, by chemical vapor deposition (CVD). The gate conductor layer may comprise a doped semiconductor material or a metallic material. Non-limiting examples of the semiconductor materials include amorphous silicon, polysilicon, an amorphous silicon germanium alloy, or a polycrystalline silicon germanium alloy. Non-limiting examples of metallic materials include W, Ta, TiN, ZrN, HfN, VN, NbN, TaN, WN, TiAlN, TaC, TaMgC, TaCN, other conductive refractory metal nitrides, and an alloy thereof. The gate conductor layer may be formed by chemical vapor deposition (CVD), physical vapor deposition (PVD), atomic layer deposition (ALD), vacuum evaporation, etc. In one embodiment, the thickness of the gate conductor layer may be from 20 nm to 300 nm.

The gate cap dielectric layer can be formed by deposition of a dielectric material. In one embodiment, the dielectric material of the gate cap dielectric layer can be silicon nitride. The thickness of the gate cap dielectric layer can be in a range from 20 nm to 300 nm, although lesser and greater thicknesses can also be employed.

The stack of the gate dielectric layer, the gate conductor layer, and the gate cap dielectric layer can be lithographically patterned by application and patterning of a photoresist material, and by transfer of the pattern in the photoresist material into the stack. Employing the patterned photoresist as an etch mask, the anisotropic etch can remove the physically exposed portions of the gate cap dielectric layer and the gate conductor layer selective to the gate dielectric layer. The exposed portions of the gate dielectric layer can subsequently be removed selective to the semiconductor material of the plurality of semiconductor fins 30, for example, by an isotropic etch such as a wet etch. A remaining portion of the gate cap dielectric layer constitutes a gate cap dielectric 58, a remaining portion of the gate conductor layer constitutes a gate electrode 52, and a remaining portion of the gate dielectric layer constitutes a gate dielectric 50. The gate dielectric 50, the gate electrode 52, and the gate cap dielectric 58 constitute a gate stack (50, 52, 58).

Figure 3A:
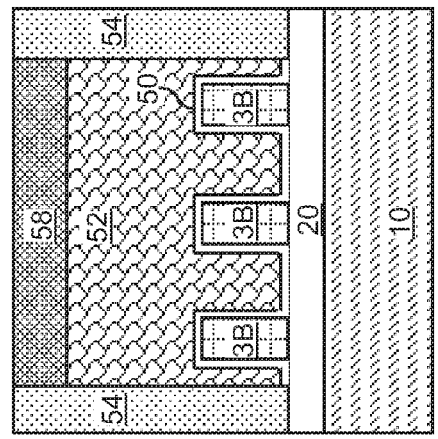
FIG. 3A is a top-down view of the first exemplary semiconductor structure after formation of a source region, a drain region, and a gate spacer according to the first embodiment of the present disclosure.
Figure 3C:
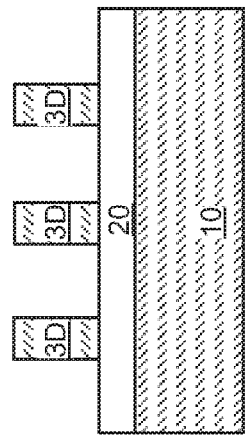
FIG. 3C is a vertical cross-sectional view of the first exemplary semiconductor structure along the vertical plane C-C' in FIG. 3A.
Figure 3B:
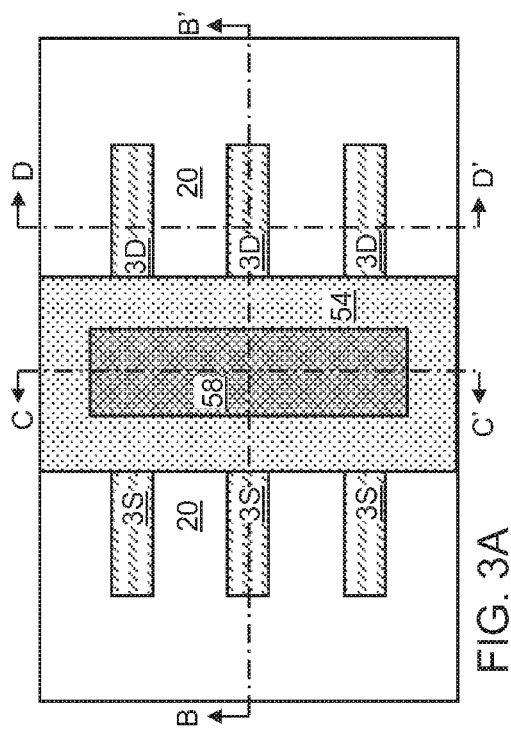
FIG. 3B is a vertical cross-sectional view of the first exemplary semiconductor structure along the vertical plane B-B' in FIG. 3A.
Figure 3D:
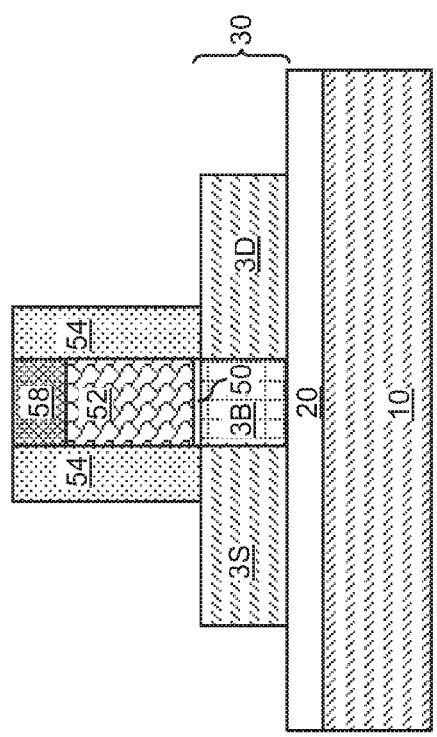
FIG. 3D is a vertical cross-sectional view of the first exemplary semiconductor structure along the vertical plane D-D' in FIG. 3A.

Referring to FIGS. 3A-3D, electrical dopants can be implanted to form a source region 3S and a drain region 3D. The gate stack (50, 52, 58) can be employed as an implantation mask during the implantation of the electrical dopants. The unimplanted regions of the semiconductor fin 30 constitute body regions 3B. Each body region 3B can be intrinsic, or can be doped with electrical dopants of a first conductivity type, which can be p-type or n-type. If the body region 3B has a doping of the first conductivity type, the source region 3S and the drain region 3D has a doping of a second conductivity type, which is the opposite conductivity type of the first conductivity type. For example, if the first conductivity type is p-type, the second conductivity type is n-type, or vice versa.

As used herein, a source region 3S includes any doped region located on one side of the body region 3B and having a different type of doping than the body region 3B, which is intrinsic (i.e., does not have any doping) or has a doping of the first conductivity type. As such, each source region 3S can include a source extension region as known in the art. As used herein, a drain region 3D includes any doped region located on the opposite side of the body region 3B and having a different type of doping than the body region 3B. As such, each drain region 3D can include a drain extension region as known in the art.

A gate spacer 54 can be formed around each gate stack (50, 52, 58). The gate spacers 54 can be formed, for example, by depositing a conformal dielectric material layer and by anisotropically etching the conformal dielectric material layer by an anisotropic etch. The anisotropic etch recesses the portions of the conformal dielectric material layer located on sidewalls of the semiconductor fins 30 and are laterally spaced from the gate electrodes (50, 52, 58) by a distance greater than the thickness of the conformal dielectric layer. The remaining vertical portions of the conformal dielectric material layer constitute the gate spacers 54. Sidewalls of the semiconductor fins 30 are physically exposed after formation of the gate spacer 54.

Referring to FIGS. 4A-4D, a photoresist layer 67 is applied over the gate stacks (50, 52, 58), the gate spacers 54, and the insulator layer 20, and is lithographically patterned to cover regions in which formation of extended active regions is to be suppressed. As used herein, extended active regions collectively refer to extended source regions that are electrically shorted to source regions and including a doped semiconductor material and extended drain regions that are electrically shorted to drain regions and including a doped semiconductor material. In one embodiment, the photoresist layer 67 can cover end portions of the gate stacks (50, 52, 58) that do not overlie the semiconductor fins 30, and physically expose regions that overlie the semiconductor fins 30.

An anisotropic etch is performed to remove physically exposed portions of the insulator layer 20. The anisotropic etch can employ the combination of the gate stacks (50, 52, 58), the gate spacers 54, and the photoresist layer 67 as an etch mask. A first opening 21A through the insulator layer 20 can be formed on a first side of the gate spacers 54 within an area laterally bounded by sidewalls of the source regions 3S, a sidewall of the gate spacer 54, and sidewalls of the photoresist layer 67. A first portion of the top surface of the single crystalline semiconductor material layer 10 is physically exposed at a bottom portion of the first opening 21A. A second opening 21B through the insulator layer 20 can be formed on a second side of the gate spacers 54 within an area laterally bounded by sidewalls of the drain regions 3D, a sidewall of the gate spacer 54, and sidewalls of the photoresist layer 67. A second portion of the top surface of the single crystalline semiconductor material layer 10 is physically exposed at a bottom portion of the second opening 21B.

Each of the first opening 21A and the second opening 21B extends to the single crystalline semiconductor material layer 10 through the insulator layer 20. An edge at which the first opening 21A adjoins the top surface of the insulator layer 20 can be vertically coincident with the first outer sidewall of the gate spacer 54, and an edge at which the second opening 21B adjoins the top surface of the insulator layer 20 can be vertically coincident with the second outer sidewall of the gate spacer 54. The photoresist layer 67 is subsequently removed, for example, by ashing.

Referring to FIGS. 5A-5D, a semiconductor material can be deposited on each physically exposed portion of the single crystalline semiconductor material layer 10 and each physically exposed end surface of the semiconductor fins (3B, 3S, 3D). At least one extended source region 60S and at least one extended drain region 60D can be formed, for example, by selective epitaxy of a semiconductor material. The extended source region 60S and an extended drain region 60D can be formed on portions of the top surface of the single crystalline semiconductor material layer 10 and the physically exposed surfaces of the semiconductor fins 30 by selective deposition of an epitaxial semiconductor material. In an illustrative example, an extended source region 60S can be formed on a first portion of the single crystalline semiconductor material layer 10 underneath the first opening 21A (See FIG. 4B) and on the surfaces of the source regions 3S, and an extended drain region 60D can be formed on a second portion of the single crystalline semiconductor material layer 10 underneath the second opening 21B (See FIG. 4B) and on the surfaces of the drain regions 3D. In one embodiment, the extended source region 60S can be formed on a sidewall of the insulator layer 20 that is vertically coincident with a sidewall of a semiconductor fin (3B, 3S, 3D), and the extended drain region 60D can be formed on another sidewall of the insulator layer 20 that is vertically coincident with a sidewall of the semiconductor fin (3B, 3S, 3D).

In one embodiment, each extended source region 60S and each extended drain region 60D can include single crystalline semiconductor material portions that are epitaxially aligned to the second semiconductor material of the semiconductor fins (3B, 3S, 3D) or the first semiconductor material of the single crystalline semiconductor material layer 10. As used herein, "epitaxial" alignment refers to alignment of atoms in a same singe crystalline structure. For example, each of the semiconductor fins (3B, 3S, 3D) and the single crystalline semiconductor material layer 10 can be single crystalline, and each of the source regions 60S and the drain regions 60D can include a portion that is epitaxially aligned to the single crystalline semiconductor material layer 10 and at least another portion that is epitaxially aligned to a semiconductor fin (3B, 3S, 3D).

The semiconductor material of each extended source region 60S and each extended drain region 60D can be the same as, or different from, the second semiconductor material, i.e., the semiconductor material of the plurality of semiconductor fins (3B, 3S, 3D). Further, the semiconductor material of each extended source region 60S and each extended drain region 60D can be the same as, or different from, the first semiconductor material, i.e., the semiconductor material of the single crystalline semiconductor material layer 10.

In selective epitaxy, the exemplary semiconductor structure can be placed in a process chamber. A reactant gas including a precursor gas for a semiconductor material is flowed into the process chamber simultaneously with, or alternately with, an etchant gas that etches a semiconductor material. The net deposition rate on the deposited semiconductor material is the difference between the deposition rate of a semiconductor material due to the reactant gas less the etch rate of the semiconductor material due to the etchant gas. The selective epitaxy process does not deposit any semiconductor material on dielectric surfaces such as the surfaces of the inner gate spacer 54 or the surface of the insulator layer 20 because any semiconductor material that nucleates on the dielectric surfaces is etched by the etchant gas before a contiguous layer of a deposited semiconductor material can be formed on the dielectric surfaces.

The reactant gas can be, for example, $SiH_4$, $SiH_2Cl_2$, $SiHCl_3$, $SiCl_4$, $Si_2H_6$, $GeH_4$, $Ge_2H_6$, $CH_4$, $C_2H_2$, or combinations thereof. The etchant gas can be, for example, HCl. A carrier gas such as $H_2$, $N_2$, or Ar can be employed in conjunction with the reactant gas and/or the etchant gas.

In one embodiment, each extended source region 60S and each extended drain region 60D can be formed with in-situ doping so that each extended source region 60S and each extended drain region 60D are doped with electrical dopants during the selective epitaxy. The extended source region 60S and the extended drain region 60D can be doped with electrical dopants of the second conductivity type, which is the opposite of the first conductivity type. Thus, the extended source region 60S and the extended drain region 60D are doped with dopants of the same conductivity type as dopants implanted into the source regions 3S and the drain regions 3D. For example, if the first conductivity type (which is the conductivity type of the plurality of semiconductor fins 30) is p-type, the second conductivity type is n-type, and vice versa.

Alternately, each extended source region 60S and each extended drain region 60D can be formed without doping so that each extended source region 60S and each extended drain region 60D are formed as intrinsic semiconductor material portions. In this case, electrical dopants can be introduced into the extended source region 60S and the extended drain region 60D in a subsequent processing step.

In one embodiment, grain boundaries may be present within each extended source region 60S and each extended drain region 60D because each extended source region 60S or each extended drain region 60D can include a plurality of single crystalline grains that grow from different single crystalline surfaces. For example, each extended source region 60S or each extended drain region 60D can include a single crystalline grain that grows from a surface of the single crystalline semiconductor material layer 10, and a plurality of grains that grow from different end surfaces of semiconductor fins (3B, 3S, 3D). In this case, each of the extended source region 60S and the extended drain region 60D can include a portion that is epitaxially aligned to the single crystalline semiconductor material layer 10 and at least another portion that is epitaxially aligned to a semiconductor fin (3B, 3S, 3D). In one embodiment, at least one grain boundary can contact the vertical sidewalls of the insulator layer 20.

In one embodiment, the top surface of the single crystalline semiconductor material layer 10 can have a (001) surface, and each of the semiconductor fins (3B, 3S, 3D) can includes a (001) top surface, (110) sidewall surfaces, and (1 1̄0) end walls. In this case, epitaxial growth along the <001> direction can proceed at a rate that is at least 1.5 times the epitaxial growth rate along the <110> directions, and the angle of the grain boundaries relative the vertical direction can be less than 45 degrees. In this case, within each of the extended source region 60S and the extended drain region 60D, a grain boundary between a portion that is epitaxially aligned to the single crystalline semiconductor material layer 10 and another portion that is epitaxially aligned to a semiconductor fin (3B, 3S, 3D) can extends from a surface of the insulator layer 20 to a top surface of the extended source region 60S or to a top surface of the extended drain region 60D.

The first exemplary semiconductor structure includes the single crystalline semiconductor material layer 10 located in a substrate, the insulator layer 20 contacting the top surface of the single crystalline semiconductor material layer 30, and at least a semiconductor fin (3B, 3S, 3D) contacting a portion of the top surface of the insulator layer 20. The gate stack (50, 52, 58) includes the gate dielectric 50 and the gate electrode 52, contacts another portion of the top surface of the insulator layer 20, and straddles each semiconductor fin (3B, 3S, 3D). The gate spacer 54 laterally surrounds the gate stack (50, 52, 58) and straddles the semiconductor fin(s) (3B, 3S, 3D). The extended source region 60S contacts, and is epitaxially aligned to, a first portion of the top surface of the single crystalline semiconductor material layer 10, and contacts a first end portion (that includes a source region 3S) of each semiconductor fin (3B, 3S, 3D) laterally protruding from a first outer sidewall 54A of the gate spacer 54. The extended drain region 60D contacts, and is epitaxially aligned to, a second portion of the top surface of the single crystalline semiconductor material layer 10, and contacts a second end portion (that includes a drain region 3D) of each semiconductor fin (3B, 3S, 3D) laterally protruding from a second outer sidewall 54B of the gate spacer 54.

In one embodiment, the extended source region 60S can contact the first outer sidewall 54A of the gate spacer 54, and the extended drain region 60D can contact the second outer sidewall 54B of the gate spacer 54. Each semiconductor fin (3B, 3S, 3D) can include a body region 3B, a source region 3S located in the first end portion and contacting the body region 3B, and a drain region 3D located in the second end portion and contacting the body region 3B and laterally spaced from the source region 3S. The source regions 3S, the drain regions 3D, the extended source region 60S, and the extended drain region 60D can have the same type of doping. Sidewalls and end walls of the insulator layer 20 can be vertically coincident with end walls and sidewalls of the first end portion and the second end portion of the semiconductor fins (3B, 3S, 3D).

The extended source region 60S and the extended drain region 60D can include a semiconductor material that is lattice mismatched to the second semiconductor material, i.e., a semiconductor material that has a different lattice constant than the second semiconductor material. In this case, the extended source region 60S and the extended drain region 60D can apply a compressive stress or a compressive strain in the body regions 3B of the semiconductor fins (3B, 3S, 3D) along the lengthwise direction of the semiconductor fins (3B, 3S, 3D). The compressive or tensile stress, and the resulting compressive or tensile strain, along the direction of current flow between each pair of a source region 3S and a drain region 3D in the same semiconductor fin (3B, 3S, 3D).

Further, the extended source region 60S and the extended drain region 60D are not free to change volumes because each of the extended source region 60S and the extended drain region 60D includes a single crystalline material portion that is epitaxially aligned to the first semiconductor material of the single crystalline semiconductor material layer 10. The single crystalline material portion that is epitaxially aligned to the first semiconductor material of the single crystalline semiconductor material layer 10 functions as a structural anchor that prevents relaxation of the lattice constant in the portions of the extended source region 60S and the extended drain region 60D that are epitaxially aligned to the source regions 3S or the drain regions 3D. Therefore, transmission of a compressive stress or a tensile stress from the extended source region 60S or the extended drain region 60D to the body regions 3B is more effective due to the epitaxial alignment of the portions of the extended source region 60S or the extended drain region 60D that are epitaxially aligned to the single crystalline semiconductor material layer 10.

Figure 6C:
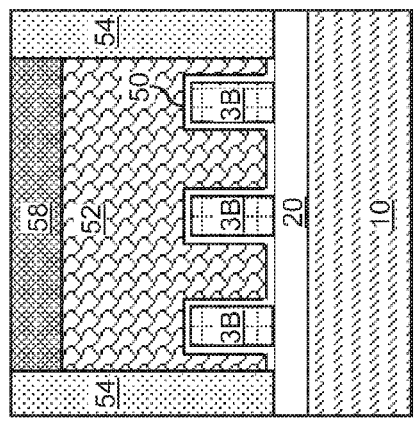
FIG. 6C is a vertical cross-sectional view of the variation of the first exemplary semiconductor structure along the vertical plane C-C' in FIG. 6A.
Figure 6D:
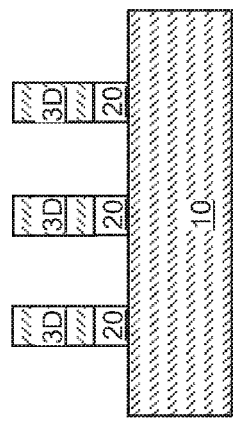
FIG. 6D is a vertical cross-sectional view of the variation of the first exemplary semiconductor structure along the vertical plane D-D' in FIG. 6A.
Figure 6A:
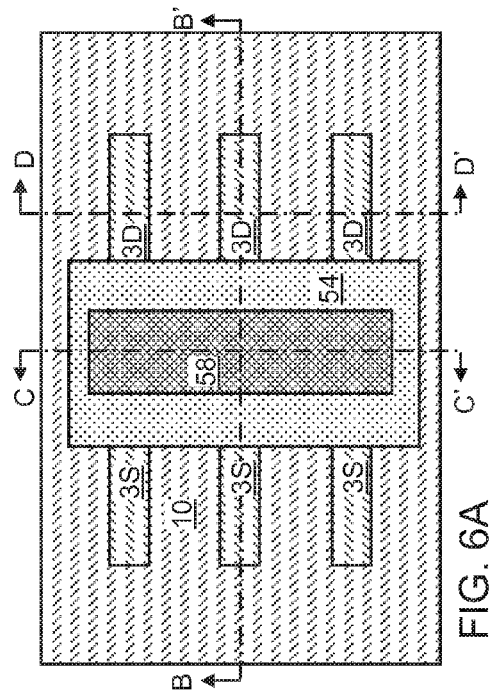
FIG. 6A is a top-down view of a variation of the first exemplary semiconductor structure after anisotropically etching through the insulator layer according to the first embodiment of the present disclosure.
Figure 6B:
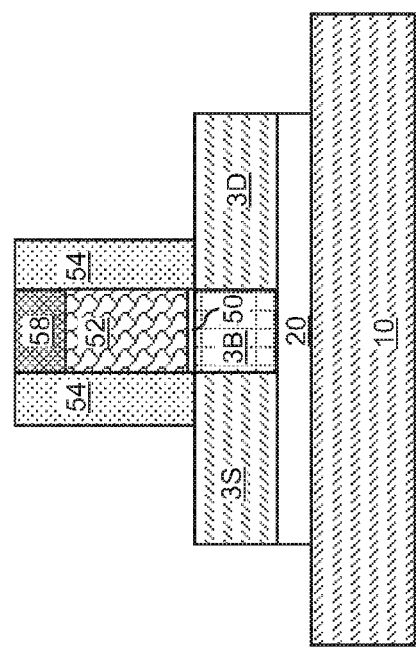
FIG. 6B is a vertical cross-sectional view of the variation of the first exemplary semiconductor structure along the vertical plane B-B' in FIG. 6A.

Referring to FIGS. 6A-6D, a variation of the first exemplary semiconductor structure can be derived from the first exemplary semiconductor structure of FIGS. 3A-3D by performing the processing steps of FIGS. 4A-4D without employing the photoresist layer 67 (See FIGS. 4A-4D). Thus, the anisotropic etch process that etches physically exposed portions of the insulator layer 20 is performed employing the combination of the gate stacks (50, 52, 48), the semiconductor fins (3B, 3S, 3D), and the gate spacers 54 as an etch mask.

All areas of the top surface of the single crystalline semiconductor material layer 10 that do not underlie the gate stack (50, 52, 58), the gate spacer 54, or the semiconductor fins (3B, 3S, 3D) can be physically exposed after the anisotropic etch. A first portion of the top surface of the single crystalline semiconductor material layer 10 is physically exposed around the sidewalls of the source regions 3S, and a second portion of the top surface of the single crystalline semiconductor material layer 10 is physically exposed around the sidewalls of the drain regions 3D.

Referring to FIGS. 7A-7D, the selective deposition step of FIGS. 5A-5D is subsequently performed to form an active semiconductor material layer 60L. The active semiconductor material layer 60L can include the same semiconductor material as the extended source region 60S and the extended drain region 60D shown in FIGS. 5A-5D. The active semiconductor material layer 60L can include a portion epitaxially aligned to the physically exposed top surface of the single crystalline semiconductor material layer 10 and portions that are epitaxially aligned to the semiconductor fins (3B, 3S, 3D). The active semiconductor material layer 60L is doped with dopants of the second conductivity type by in-situ doping or ex-situ doping.

A photoresist layer 77 is applied over the active semiconductor material layer 60L, and is lithographically patterned to cover areas in which an extended source region 60S and an extended drain region 60D are to be formed.

Referring to FIGS. 8A-8D, the deposited semiconductor material of the active semiconductor material layer 60L is patterned employing the patterned photoresist layer 77 as an etch mask. Physically exposed portions of the active semiconductor material layer 60L can be removed by an anisotropic etch. Portions of the top surface of the single crystalline semiconductor material layer 10 can be physically exposed after patterning the deposited semiconductor material. A first remaining portion of the active semiconductor material layer 60L contacting the sidewalls of the source regions 3S is an extended source region 60S, and a remaining portion of the active semiconductor material layer 60L contacting the sidewalls of the drain regions 3D is an extended drain region 60D. The photoresist layer 77 can be subsequently removed, for example, by ashing.

In one embodiment, grain boundaries may be present within each extended source region 60S and each extended drain region 60D because each extended source region 60S or each extended drain region 60D can include a plurality of single crystalline grains that grow from different single crystalline surfaces. For example, each extended source region 60S or each extended drain region 60D can include a single crystalline grain that grows from a surface of the single crystalline semiconductor material layer 10, and a plurality of grains that grow from different end surfaces of semiconductor fins (3B, 3S, 3D). In this case, each of the extended source region 60S and the extended drain region 60D can include a portion that is epitaxially aligned to the single crystalline semiconductor material layer 10 and at least another portion that is epitaxially aligned to a semiconductor fin (3B, 3S, 3D). In one embodiment, at least one grain boundary can contact the vertical sidewalls of the insulator layer 20.

In one embodiment, the top surface of the single crystalline semiconductor material layer 10 can have a (001) surface, and each of the semiconductor fins (3B, 3S, 3D) can includes a (001) top surface, (110) sidewall surfaces, and (1 1̄0) end walls. In this case, epitaxial growth along the <001> direction can proceed at a rate that is at least 1.5 times the epitaxial growth rate along the <110> directions, and the angle of the grain boundaries relative the vertical direction can be less than 45 degrees. In this case, within each of the extended source region 60S and the extended drain region 60D, a grain boundary between a portion that is epitaxially aligned to the single crystalline semiconductor material layer 10 and another portion that is epitaxially aligned to a semiconductor fin (3B, 3S, 3D) can extends from a surface of the insulator layer 20 to a top surface of the extended source region 60S or to a top surface of the extended drain region 60D.

Referring to FIGS. 9A-9D, a second exemplary semiconductor structure according to the second embodiment of the present disclosure can be derived from the first exemplary semiconductor structure of FIGS. 4A-4D by laterally etching the insulator layer 20 by an isotropic etch. The isotropic etch can be a wet etch or a dry etch. The duration of the isotropic etch is controlled so that the portions of the insulator layer 20 that protrude from the outer sidewalls (54A, 54B) of the gate spacer 54 are removed, while a portion of the insulator layer 20 remains underneath the gate stack (50, 52, 58). Each source region 30S includes a physically exposed bottom surface. Each drain region 30D includes a physically exposed bottom surface. The photoresist layer 67 is subsequently removed, for example, by ashing.

Figure 10A:
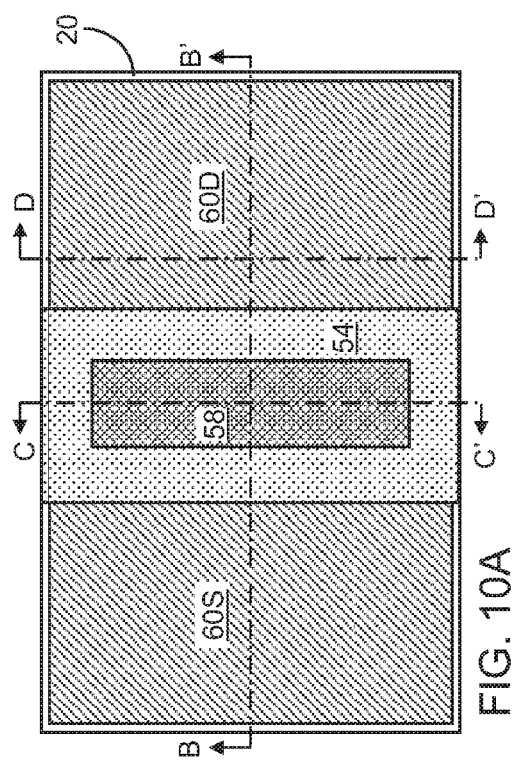
FIG. 10A is a top-down view of the second exemplary semiconductor structure after formation of an extended source region and an extended drain region according to the second embodiment of the present disclosure.
Figure 10B:
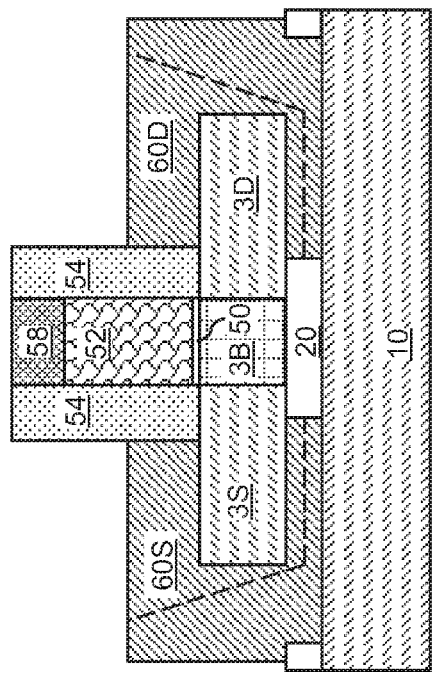
FIG. 10B is a vertical cross-sectional view of the second exemplary semiconductor structure along the vertical plane B-B' in FIG. 10A.
Figure 10C:
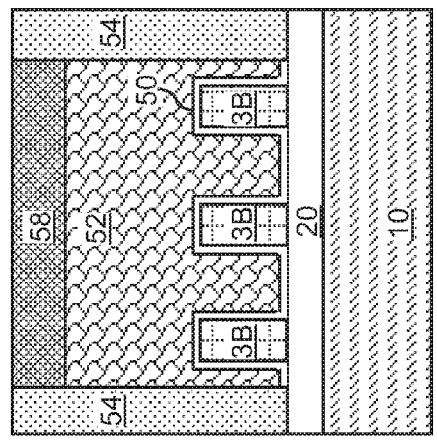
FIG. 10C is a vertical cross-sectional view of the second exemplary semiconductor structure along the vertical plane C-C' in FIG. 10A.
Figure 10D:
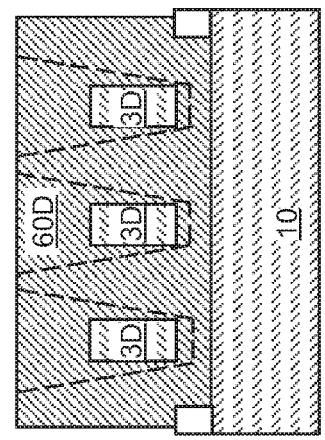
FIG. 10D is a vertical cross-sectional view of the second exemplary semiconductor structure along the vertical plane D-D' in FIG. 10A.

Referring to FIGS. 10A-10D, the processing step of FIGS. 5A-5D is performed to form an extended source region 60S and an extended drain region 60D. In one embodiment, grain boundaries may be present within each extended source region 60S and each extended drain region 60D because each extended source region 60S or each extended drain region 60D can include a plurality of single crystalline grains that grow from different single crystalline surfaces. For example, each extended source region 60S or each extended drain region 60D can include a single crystalline grain that grows from a surface of the single crystalline semiconductor material layer 10, and a plurality of grains that grow from different end surfaces of semiconductor fins (3B, 3S, 3D). In this case, each of the extended source region 60S and the extended drain region 60D can include a portion that is epitaxially aligned to the single crystalline semiconductor material layer 10 and at least another portion that is epitaxially aligned to a semiconductor fin (3B, 3S, 3D). In one embodiment, at least one grain boundary can contact the vertical sidewalls of the insulator layer 20.

In one embodiment, the top surface of the single crystalline semiconductor material layer 10 can have a (001) surface, and each of the semiconductor fins (3B, 3S, 3D) can includes a (001) top surface, (110) sidewall surfaces, and (1 $\bar{1}$0) end walls. In this case, epitaxial growth along the <001> direction can proceed at a rate that is at least 1.5 times the epitaxial growth rate along the <110> directions, and the angle of the grain boundaries relative the vertical direction can be less than 45 degrees. Within each of the extended source region 60S and the extended drain region 60D, a grain boundary between the portion that is epitaxially aligned to the single crystalline semiconductor material layer 10 and another portion that is epitaxially aligned to a semiconductor fin (3B, 3S, 3D) can underlie a portion of the semiconductor fin (3B, 3S, 3D). In this case, within each of the extended source region 60S and the extended drain region 60D, a grain boundary between a portion that is epitaxially aligned to the single crystalline semiconductor material layer 10 and another portion that is epitaxially aligned to a semiconductor fin (3B, 3S, 3D) can extends from a surface of the insulator layer 20 to a top surface of the extended source region 60S or to a top surface of the extended drain region 60D. The surface from which the grain boundary extends can be a surface of the insulator layer 30 that underlies the gate stack (50, 52, 58).

In one embodiment, a grain boundary in the extended source region 60S can underlie a first end portion of each semiconductor fin (3B, 3S, 3D) that includes a source region 3S, and a grain boundary in the extended drain region 60D can underlie a second end portion of each semiconductor fin (3B, 3S, 3D) that includes a drain region 3D.

The extended source region 60S and the extended drain region 60D can include a semiconductor material that is lattice mismatched to the second semiconductor material, i.e., a semiconductor material that has a different lattice constant than the second semiconductor material. In this case, the extended source region 60S and the extended drain region 60D can apply a compressive stress or a compressive strain in the body regions 3B of the semiconductor fins (3B, 3S, 3D) along the lengthwise direction of the semiconductor fins (3B, 3S, 3D). The compressive or tensile stress, and the resulting compressive or tensile strain, along the direction of current flow between each pair of a source region 3S and a drain region 3D in the same semiconductor fin (3B, 3S, 3D).

Further, the extended source region 60S and the extended drain region 60D are not free to change volumes because each of the extended source region 60S and the extended drain region 60D includes a single crystalline material portion that is epitaxially aligned to the first semiconductor material of the single crystalline semiconductor material layer 10. The single crystalline material portion that is epitaxially aligned to the first semiconductor material of the single crystalline semiconductor material layer 10 functions as a structural anchor that prevents relaxation of the lattice constant in the portions of the extended source region 60S and the extended drain region 60D that are epitaxially aligned to the source regions 3S or the drain regions 3D. Therefore, transmission of a compressive stress or a tensile stress from the extended source region 60S or the extended drain region 60D to the body regions 3B is more effective due to the epitaxial alignment of the portions of the extended source region 60S or the extended drain region 60D that are epitaxially aligned to the single crystalline semiconductor material layer 10.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    forming a semiconductor fin on a stack, from bottom to top, of a single crystalline semiconductor material layer and an insulator layer, wherein said semiconductor fin comprises a source region located in a first end portion of the semiconductor fin, and a drain region located in a second end portion of the semiconductor fin, and said insulator layer overlaps with only a portion of said source region and said drain region;
    forming a gate stack over said semiconductor fin;
    forming a gate spacer around said gate stack, wherein said insulator layer overlaps with only a portion of said gate spacer;
    physically exposing a first portion and a second portion of a top surface of said single crystalline semiconductor material layer; and
    forming an extended source region on said first portion and an extended drain region on said second portion by selective deposition of an epitaxial semiconductor material on said first portion, said second portion, and physically exposed surfaces of said semiconductor fin.

2. The method of claim 1, wherein said physical exposing of said first and second portions of said top surface of said single crystalline semiconductor material layer is performed by anisotropically etching physically exposed portions of said insulator layer employing said semiconductor fin, said gate stack, and said gate spacer as an etch mask.

3. The method of claim 1, further comprising forming said source region and said drain region in said semiconductor fin by implanting dopants into said semiconductor fin employing said gate stack as an implantation mask, wherein an unimplanted portion of said semiconductor fin constitutes a body region.

4. The method of claim 3, further comprising doping said extended source region and said extended drain region with dopants of a same conductivity type as dopants implanted into said source region and said drain region.

5. The method of claim 1, wherein said extended source region is formed on a sidewall of said insulator layer that is vertically coincident with a sidewall of said semiconductor fin, and said extended drain region is formed on another sidewall of said insulator layer that is vertically coincident with said sidewall of said semiconductor fin.

6. The method of claim 1, wherein said physical exposing of said first and second portions of said top surface of said single crystalline semiconductor material layer is performed by:
- anisotropically etching physically exposed portions of said insulator layer employing said semiconductor fin, said gate stack, and said gate spacer as an etch mask; and
- laterally recessing said insulator layer.

7. The method of claim 1, wherein one of said extended source region and said extended drain region includes a portion that is epitaxially aligned to said single crystalline semiconductor material layer and another portion that is epitaxially aligned to said semiconductor fin.

8. The method of claim 7, wherein a grain boundary between said portion that is epitaxially aligned to said single crystalline semiconductor material layer and said another portion that is epitaxially aligned to said semiconductor fin extends from a surface of said insulator layer to a top surface of said extended source region or to a top surface of said extended drain region.

9. The method of claim 7, wherein a grain boundary between said portion that is epitaxially aligned to said single crystalline semiconductor material layer and said another portion that is epitaxially aligned to said semiconductor fin underlies a portion of said semiconductor fin.

10. The method of claim 1, wherein said extended source region and said extended drain region are formed by:
- selectively depositing a semiconductor material on said first and second portions of said top surface of said semiconductor material layer and on physically exposed surfaces of said semiconductor fin; and
- patterning said deposited semiconductor material, wherein a first remaining portion of said deposited semiconductor material is said extended source region, a second remaining portion of said deposited semiconductor material is said extended drain region.

11. The method of claim 1, wherein said top surface of said single crystalline semiconductor material layer has a (001) surface and said semiconductor fin comprises a (001) top surface, (110) sidewall surfaces, and (1$\bar{1}$0) end walls.

12. The method of claim 1, wherein said gate spacer comprises a first outer sidewall and a second outer sidewall, and wherein said extended source region is formed to contact said first outer sidewall of said gate spacer, and said extended drain region is formed to contact said second outer sidewall of said gate spacer.

13. The method of claim 12, wherein said first end portion laterally protrudes from said first outer sidewall of said gate spacer and said second end portion laterally protrudes from said second outer sidewall of said gate spacer, wherein said extended source region is formed to contact said first end portion of said semiconductor fin, and said extended drain region is formed to contact said second end portion of said semiconductor fin.

14. The method of claim 13, wherein said physical exposing of said first and second portions of said top surface of said single crystalline semiconductor material layer is performed by isotropically etching physically exposed portions of said insulator layer.

15. The method of claim 14, wherein said isotropically etching physically exposed portions of said insulator layer comprises laterally etching a portion of said insulator layer that protrudes from said first outer sidewall or said second outer sidewall of said gate spacer.

16. The method of claim 14, wherein a portion of said extended source region underlies said first end portion of said semiconductor fin, and a portion of said extended drain region underlies said second end portion of said semiconductor fin.

17. The method of claim 16, wherein one of said extended source region and said extended drain region applies stress in a body region of said semiconductor fin along a lengthwise direction.

18. The method of claim 16, wherein a grain boundary in said extended source region underlies said first end portion of said semiconductor fin, and a grain boundary in said extended drain region underlies said second end portion of said semiconductor fin.

19. The method of claim 1, wherein one of said extended source region and said extended drain region applies stress in a body region of said semiconductor fin along a lengthwise direction.

* * * * *